US012594654B2

(12) United States Patent
Chien

(10) Patent No.: US 12,594,654 B2
(45) Date of Patent: Apr. 7, 2026

(54) COLD PLATE REMOVAL DEVICE

(71) Applicant: DELL PRODUCTS L.P., Round Rock, TX (US)

(72) Inventor: Tung Yu Chien, New Taipei City (TW)

(73) Assignee: Dell Products L.P., Round Rock, TX (US)

( * ) Notice: Subject to any disclaimer, the term of this patent is extended or adjusted under 35 U.S.C. 154(b) by 215 days.

(21) Appl. No.: 18/541,632

(22) Filed: Dec. 15, 2023

(65) Prior Publication Data

US 2025/0196303 A1 Jun. 19, 2025

(51) Int. Cl.
B23P 19/04 (2006.01)
B25B 27/02 (2006.01)
H05K 7/20 (2006.01)

(52) U.S. Cl.
CPC ............ B25B 27/023 (2013.01); B23P 19/04 (2013.01); H05K 7/20254 (2013.01); H05K 7/20772 (2013.01)

(58) Field of Classification Search
CPC .......... H05K 7/20254; H05K 7/20763–20772; B23P 19/04; B25B 27/023
See application file for complete search history.

(56) References Cited

U.S. PATENT DOCUMENTS

| | | | |
|---|---|---|---|
| 8,405,975 B2 | 3/2013 | Helberg et al. | |
| 10,065,407 B2 * | 9/2018 | Kyle | B32B 43/006 |
| 11,553,624 B1 * | 1/2023 | Holland | H05K 7/20509 |
| 2019/0166724 A1 | 5/2019 | Moss et al. | |
| 2024/0155796 A1 * | 5/2024 | Sunder | H05K 7/20636 |

FOREIGN PATENT DOCUMENTS

| | | | | |
|---|---|---|---|---|
| CN | 215727830 U | * | 2/2022 | |
| CN | 117021027 A | * | 11/2023 | B25B 27/00 |

* cited by examiner

*Primary Examiner* — Zachary Pape
(74) *Attorney, Agent, or Firm* — Larson Newman, LLP

(57) ABSTRACT

A cold plate removal device includes a main portion, an arm portion, and a pivot screw. The arm portion extends from the main portion and provides a leverage force to the main portion. The pivot screw in physical communication with the arm portion. The pivot screw transitions between an upper position and lower position. The pivot screw exerts a force on the arm portion when the pivot screw is in the lower position and in physical communication with a graphics processing unit module.

20 Claims, 5 Drawing Sheets

COLD PLATE REMOVAL DEVICE

FIELD OF THE DISCLOSURE

The present disclosure generally relates to information handling systems, and more particularly relates to a cold plate removal device.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A cold plate removal device includes a main portion, an arm portion, and a pivot screw. The arm portion may extend from the main portion and provide a leverage force to the main portion. The pivot screw may be in physical communication with the arm portion. The pivot screw may transition between an upper position and lower position. The pivot screw may exert a force on the arm portion when the pivot screw is in the lower position and in physical communication with a graphics processing unit module.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
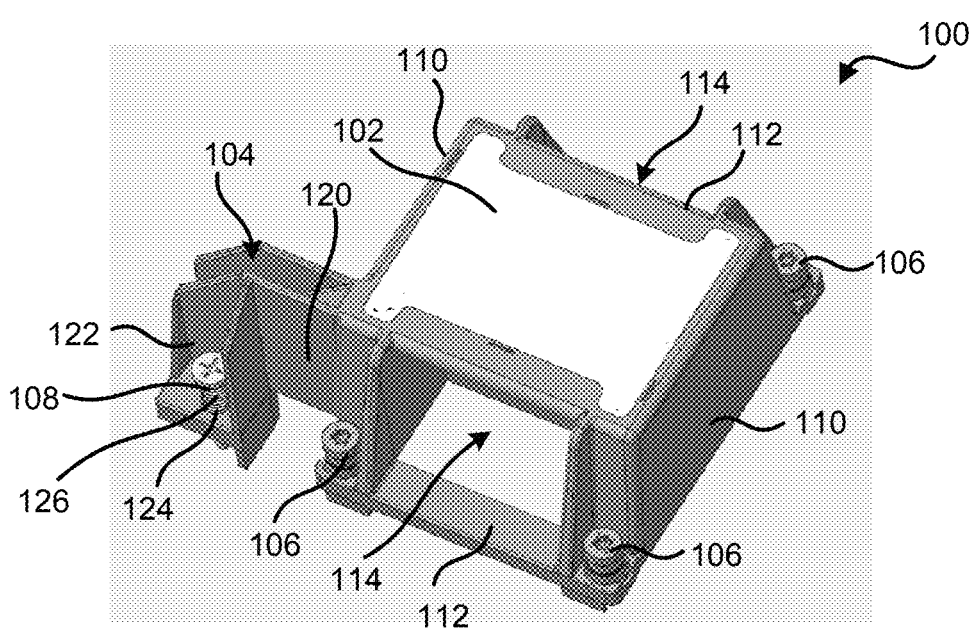
FIGS. 1 and 2 are diagrams of a cold plate removal device according to at least one embodiment of the present disclosure.
Figure 2:
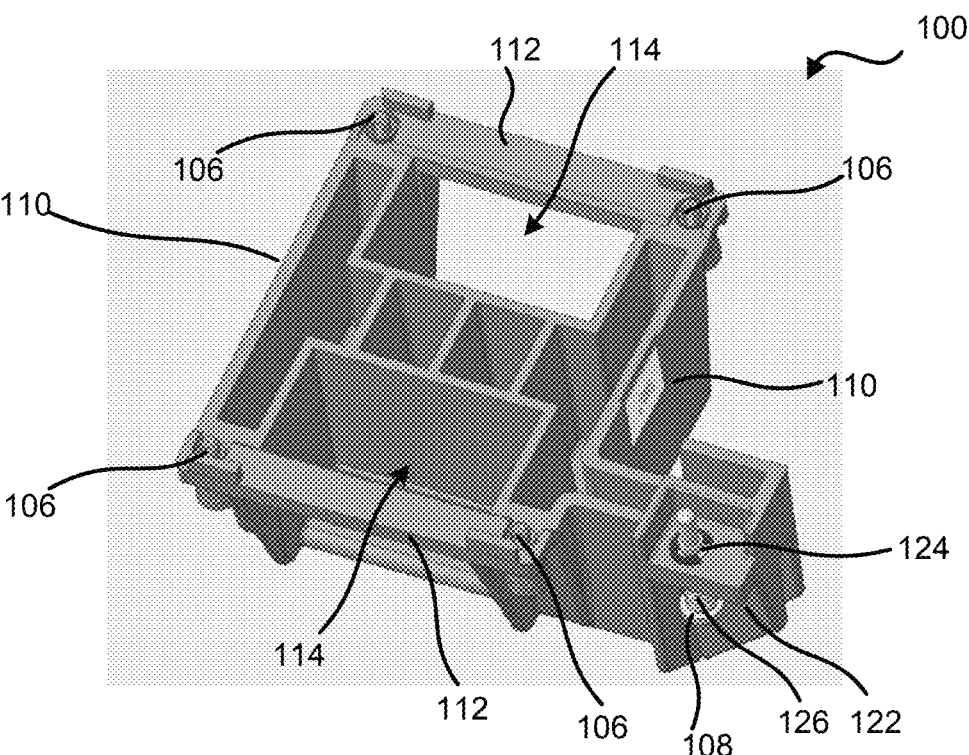

FIGS. 1 and 2 illustrate a cold plate removal device 100 for an information handling system according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Cold plate removal device 100 includes a main portion 102, an arm portion 104, connection screw 106, and a removal screw 108. Main portion 102 includes sides 110, base supports 112, and hand inserts 114. Arm portion 104 includes an extension portion 120, a pivot portion 122, and a removal hole 124. Cold plate removal device 100 also includes a spring 126 in physical communication with a head of removal screw 108 and arm portion 104. Cold plate removal device 100 may include additional components without varying from the scope of this disclosure.

A different one of connection screws 106 may be connected in a different corner of cold plate removal device 100.

In an example, each side 110 and each base support 112 may extend between a different set of connection screws 106. In certain examples, cold plate removal device 100 may include four connection screws 106. In these examples, a first side 110 may extend from a first connection screw 106, to a second connection screw 106. A first base support 112 may extend from the second connection screw 106 to a third connection screw 106. A second side 110 may extend from third connection screw 106 to a fourth connection screw 106. A second base support 112 may be extend from fourth connection screw 106 to the first connection screw 106.

In an example, arm portion 104, via extension portion 120 and pivot portion 122, may provide a leverage force to main portion 102 based on a force from pivot screw 108. In certain examples, the leverage force may increase the force from pivot screw 108 to a greater pivotal upward force in main portion 102 of cold plate removal device 100. The pivotal upward force may enable cold plate removal device 100 to remove a cold plate, such as cold plate 302 of FIG. 3, from a graphic processing unit (GPU), such as GPU chipset 612 of FIG. 6.

Figure 3:
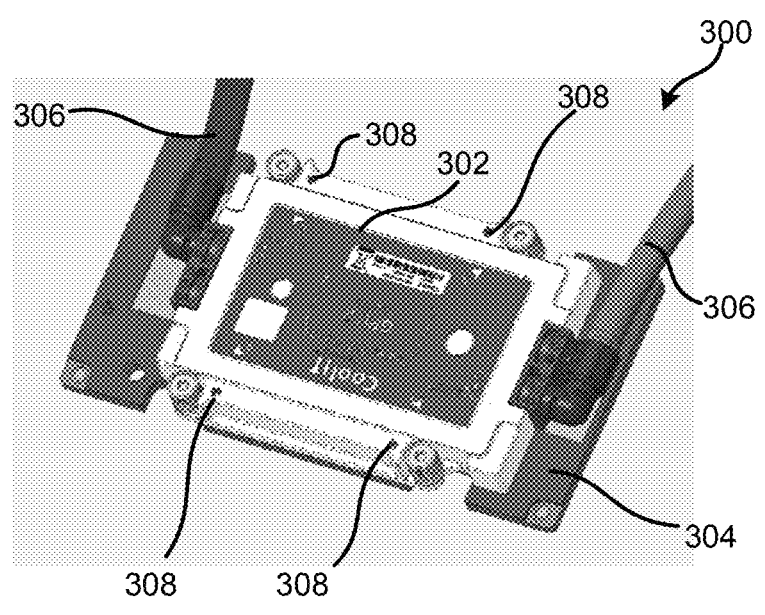
FIG. 3 is a diagram of a cold plate on a graphics processing unit according to at least one embodiment of the present disclosure.

FIG. 3 illustrates a cold plate system 300 according to at least one embodiment of the present disclosure. Cold plate system 300 includes a cold plate 302, a base 304, cooling liquid pipes 306, and attachment holes 308. Cold plate system 300 may be a direct liquid cooling cold plate. Cold plate system 300 may include additional components without varying from the scope of this disclosure.

In an example, cold plate 302 may be in physical communication with base 304 and with cooling liquid pipes 306. Base 304 may be in physical communication with different sections of thermal interface materials (TIMs), such as TIMs 610 of FIG. 6. In certain examples, the TIMs may be phase change TIMs, non-phase change TIMs, or a combination of phase change and non-phase change TIMs. Cooling liquid pipes 306 may be utilized to circulate a cooling liquid through cold plate 302, and this cooling liquid may remove heat from the cold plate.

Figure 6:
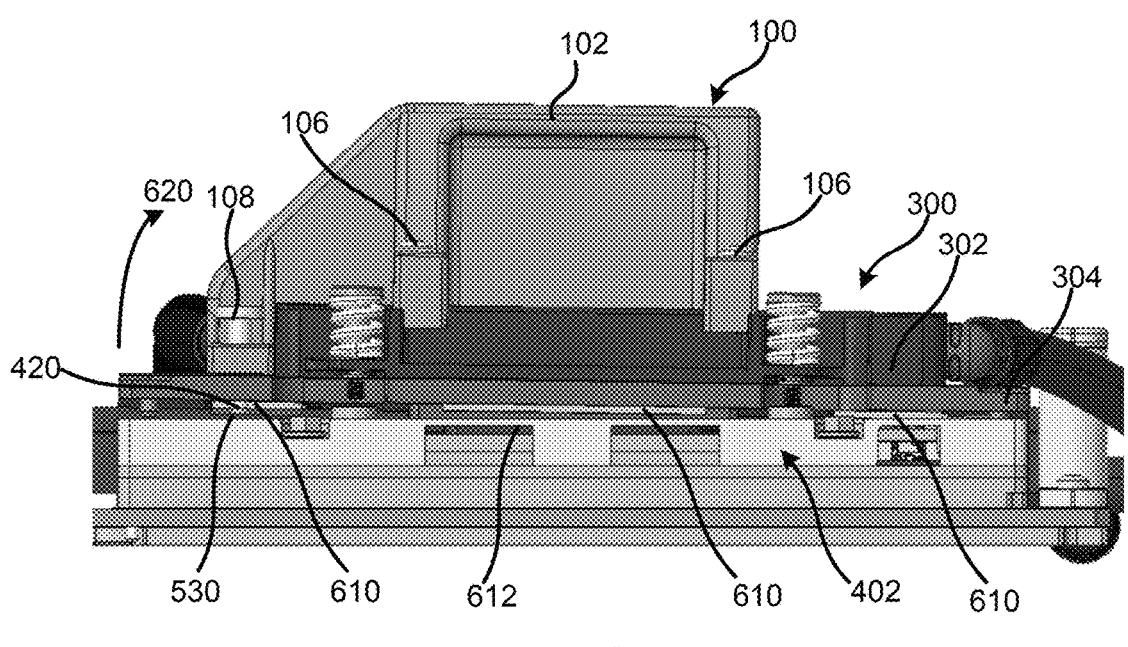
FIG. 6 is a side view of a cold plate removal device and a cold plate in a first removal stage according to at least one embodiment of the present disclosure.

In certain examples, cold plate system 300 may be placed in physical communication with a graphics processing unit (GPU), such as GPU 612 of FIG. 6, via TIMs. In an example, heat generated by the GPU may be transferred to cold plate 302 via base 304 and TIMs, and this heat may be removed by the cooling liquid. In certain examples, a bonding force may be created by the TIM between a GPU chipset and base 304 of cold plate system 300. If cold plate system 300 should be removed from GPU chipset, a large amount of force may need to be applied to the cold plate system to overcome the bonding force. For example, the amount of force needed to overcome the bonding force may be fourteen kilogram-force, fifteen kilogram-force, sixteen kilogram-force, or the like.

In an example, a removal device, such as cold plate removal device 100 of FIG. 1, may be connected to cold plate 302 of cold plate system 300 to enable an individual to exert a force on the cold plate system that is greater than the bonding force between based 304 and the GPU chipset. The removal of cold plate system 300 via cold plate removal device 100 of FIG. 1 will be described with respect to FIGS. 4-7 below.

Figure 4:
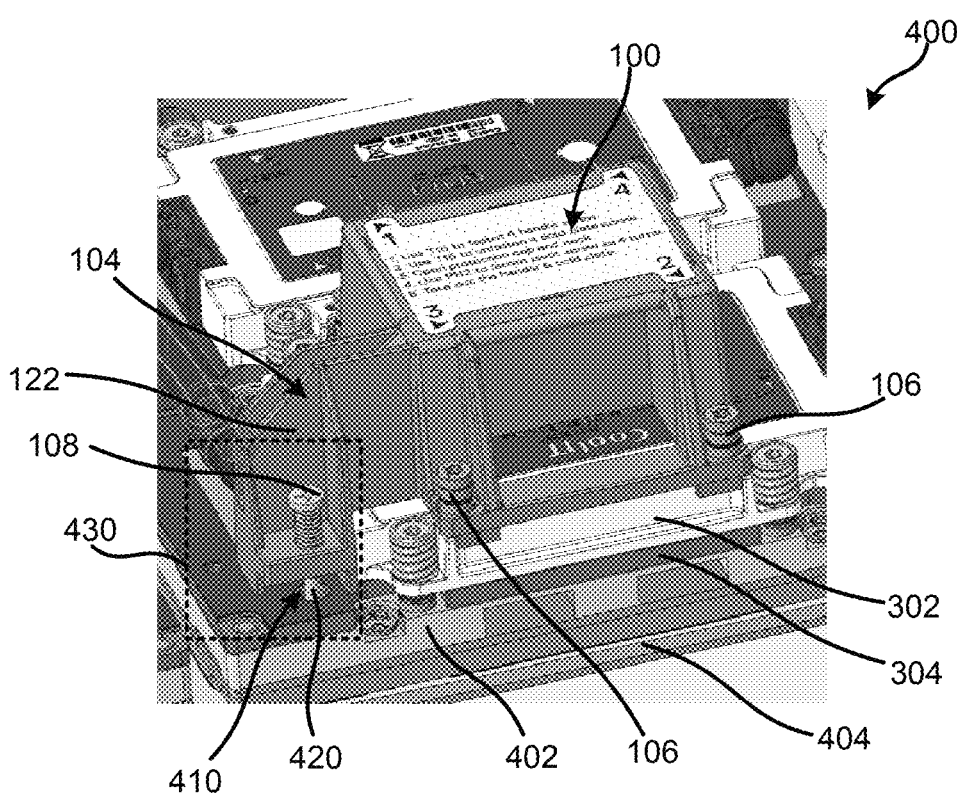
FIG. 4 is a perspective view of a portion of an information handling system including a cold plate removal device, a cold plate, and a graphics processing unit according to at least one embodiment of the present disclosure.

FIG. 4 illustrates a portion of an information handling system 400 according to at least one embodiment of the present disclosure. Information handling system 400 includes a GPU module 402, a motherboard 404, cold plate removal device 100, and cold plate system 300. GPU module 402 may include a GPU chipset, such as GPU chipset 612 of FIG. 6. Base 304 of cold plate system 300 includes a hole 410. Pivot screw 108 includes an end 420 that may extend through hole 410. Information handling system 400 may include additional components without varying from the scope of this disclosure.

In an example, cold plate removal device 100 may be securely attached to cold plate 302 via connection screws 106. For example, a different connection screw 106 may inserted within a different attachment hole of cold plate 302, such as attachment holes 308 in FIG. 3. In certain examples, the inserted or connection between a connection screw 106 and a corresponding attachment hole may be via any suitable manner, such as a threaded connection. Based on the secure connection between cold plate removal device 100 and cold plate 302 of cold plate system 300, any force exerted on the cold plate removal device may be transferred to the cold plate system. For example, as cold plate removal device 100 is forced upward via pivot screw 108, the force may be transferred to cold plate 302 through connection screw 106 and attachment holes 308. This force on cold plate 302 may cause the cold plate to transition from a fully attached position to an intermediate position as will be described with respect to FIG. 6 below. The interface between pivot screw 108 and pivot portion 122 of arm portion 104 will be described based on a cross section identified by arrows 430.

Figure 5:
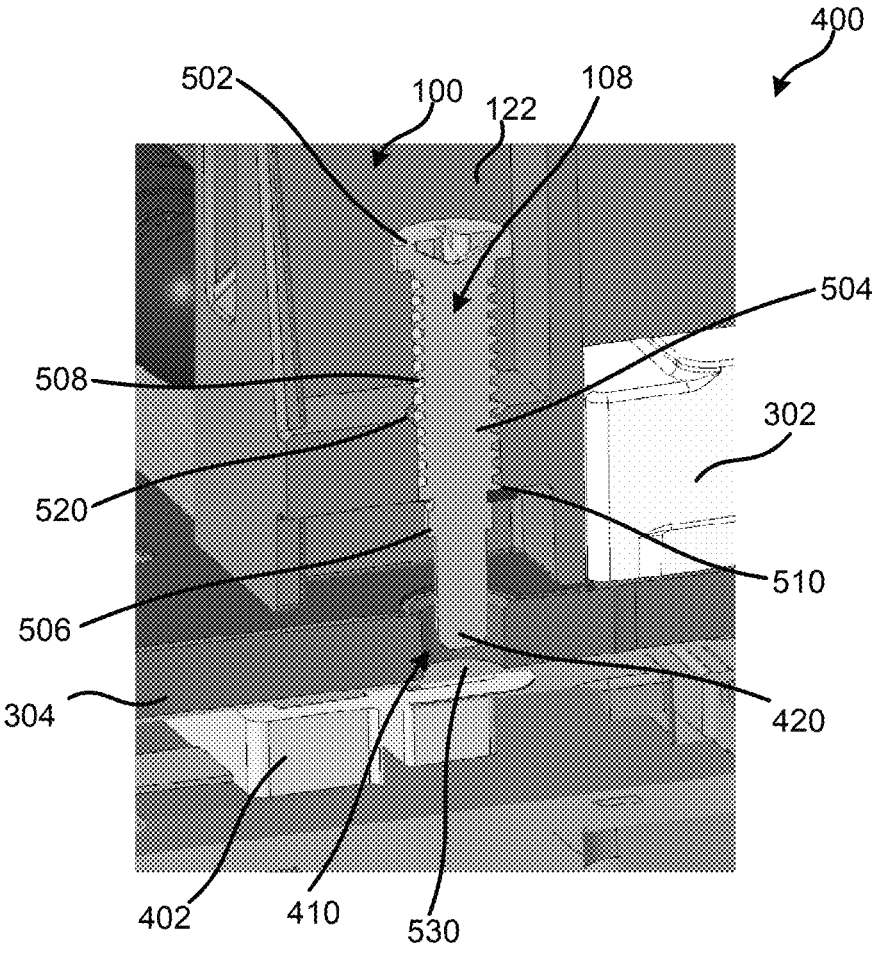
FIG. 5 is a cross sectional view of a portion of an information handling system including a cold plate removal device, a cold plate, and a graphics processing unit according to at least one embodiment of the present disclosure.

FIG. 5 is a cross section of a portion of information handling system 400 including pivot portion 122 of cold plate removal device 100, pivot screw 108, cold plate 302, base 304, and GPU module 402 according to at least one embodiment of the present disclosure. Pivot screw 108 includes a head 502, a main body 504, a stop 506, threads 508 around the main body, and end 420. A washer 510 or other similar component may snap fit around pivot screw 108. In an example, washer 510 may be located between threads 508 and lock 506. Pivot portion 520 includes a threaded hole 520, which in turn in placed in physical communication with threads 508 of pivot screw 108. GPU module 402 includes a top surface 530.

In an example, pivot screw 108 may transition between an upper position and a lower position. In certain examples, an individual may engage with pivot screw 108 via head 502. Pivot screw 108 may be rotated either clockwise or counterclockwise. Based on the direction of rotation, pivot screw 108 may transition from the upper position to the lower position or transition from the lower position to the upper position. When pivot screw 108 is in the upper position, washer 510 may be in physical communication with a surface of pivot portion 122 below threaded hole 520. When pivot screw 108 is in the lower position, end 420 of the pivot screw is in physical communication top surface 530 of GPU module 402. If the pivot screw 108 is continued to be rotated in the same direction that causes the transition of the pivot screw toward the lower position, the pivot screw may transition toward a cold plate initial removal position as will be described with respect to FIG. 6 below.

FIG. 6 illustrates cold plate 302 and all of cold plate system 300 in an initial removal position according to at least one embodiment of the present disclosure. As pivot screw 108 is rotated in a particular direction, the threads 508 in FIG. 6 of pivot screw 108 may continue to add toque on cold plate removal system 100. In an example, this torque may continue to be added until a reaction force, in the direction of arrow 620, overcomes the bonding force of phase change TIMs 610 and moves at least a portion of base 304 and cold plate 302 away from top surface 530 of CPU module 402. This movement of cold plate system 300 may only be possible if a force exerted on the cold plate system is greater than the bonding force between GPU chipset 612 and base 304 of cold plate 302 created by TIMs 610.

As illustrated in FIG. 6, pivot screw 108 may be located near one corner of main portion 304 of cold plate system 300. Based on the location of pivot screw 108 with respect to cold plate system 300, the force on cold plate 302 may be pivotal force as indicated by arrow 620. In an example, pivot portion 122 may transfer the force from pivot screw 108 to main portion 102, which in turn may transfer the force to cold plate 302 via connection screws 106. In this example, one side or end of base 304 and cold plate 302 may separate farther from top surface 530 of GPU module 402 as compared to another side or end of base and the cold plate. In an example, even though the bonding force created by a first portion of TIMs 610 is overcome by the movement of cold plate 302, the bonding force created by another portion of the TIMs may not be completely exceeded. In certain examples, an individual may grab and pull cold plate removal device 100 and cold plate system 300 completely away from GPU chipset 612 and GPU module 402 as will be described with respect to FIG. 7.

Figure 7:
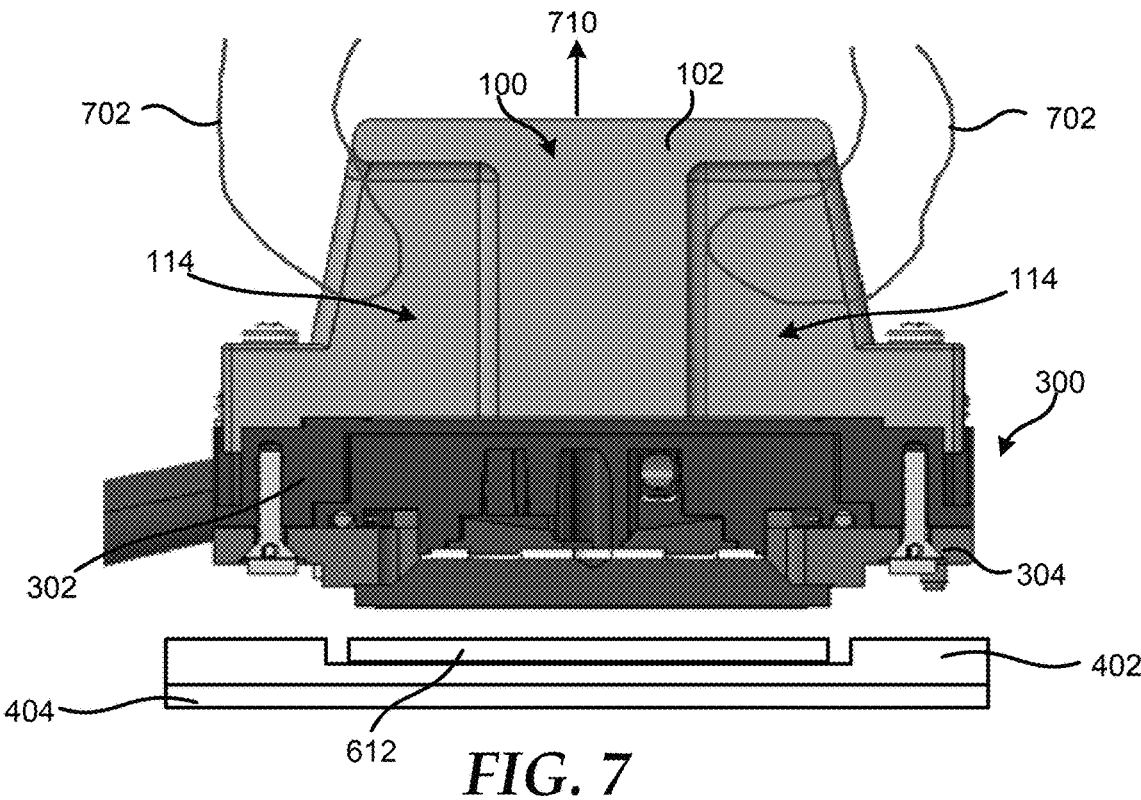
FIG. 7 is a cross sectional view of a cold plate removal device and a cold plate according to at least one embodiment of the present disclosure.

FIG. 7 illustrates a cross section view of cold plate removal device 100 and cold plate system 300 according to at least one embodiment of the present disclosure. In an example, when cold plate 302 is in the initial removal position, an individual may grab cold plate removal device 100 by inserting fingers 702 within hand inserts 114 of the cold plate removal device. The individual may pull up on main portion 102 of cold plate removal device 100. Based on the pulling up on main portion 102, a force may be exerted on cold plate removal device 100 and cold plate 302 in the direction of arrow 710. In an example, the force in the direction of arrow 710 may overcome any remaining bonding forces by TIMs 610 of FIG. 6, such that base 304 may be removed from GPU chipset 612, GPU module 402, and motherboard 404. Thus, cold plate removal device 100 may be utilized to overcome the bonding force between cold plate 302 and GPU chipset 612 created by TIM 610 of FIG. 6 and remove the cold plate from the GPU chipset. While cold plate removal device 100 and cold plate 300 have been described herein with respect to a GPU, the cold plate may be in physical communication with a CPU, such as CPU 802 of 804 of FIG. 8, without varying from the scope of this disclosure.

Figure 8:
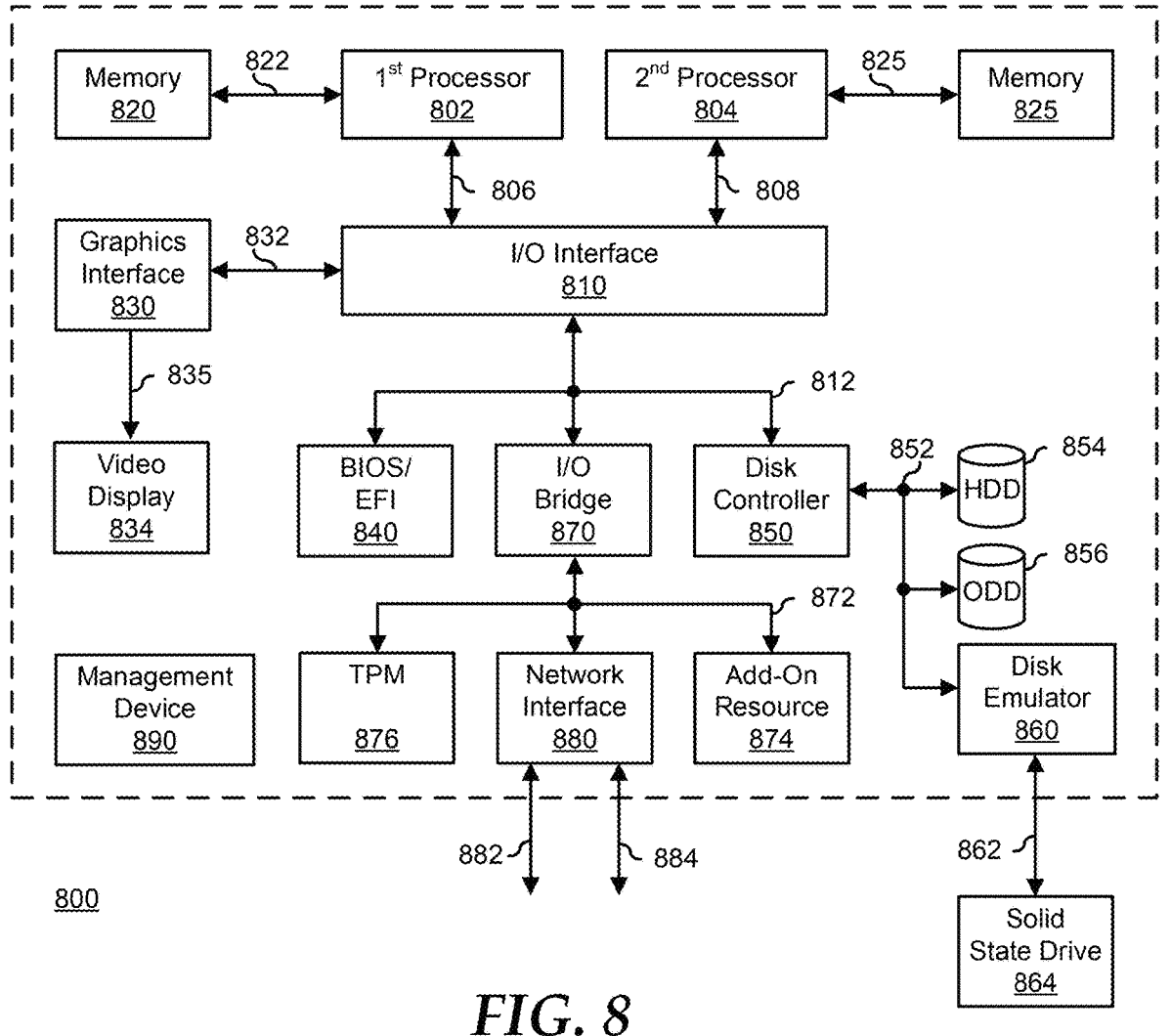
FIG. 8 is a block diagram of a general information handling system according to an embodiment of the present disclosure.

FIG. 8 shows a generalized embodiment of an information handling system 800 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below and operates to perform one or more of the methods described below. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 862, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 862, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832 and provides a video display output 836 to a video display 834. In a particular embodiment, information handling system 800 includes separate memories that are dedicated to each of processors 802 and 804 via separate memory interfaces. An example of memories 820 and 830 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 4394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812 or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800.

Management device 890 can operate off of a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A cold plate removal device comprising:
a main portion;
an arm portion extending from the main portion, the arm portion to provide a leverage force to the main portion; and
a pivot screw in physical communication with the arm portion, the pivot screw to transition between an upper position and lower position, the pivot screw to exert a force on the arm portion when the pivot screw is in the lower position and in physical communication with a graphics processing unit module.

2. The cold plate removal device of claim 1, wherein the arm portion includes a pivot portion and a removal hole within the pivot portion, the removal hole is in physical communication with the pivot screw.

3. The cold plate removal device of claim 2, wherein the pivot screw includes threads, a stop, and a washer, wherein the washer is in physical communication with the stop and a lower surface of the removal hole when the pivot screw is in the upper position.

4. The cold plate removal device of claim 3, wherein the washer is located between the threads and the stop.

5. The cold plate removal device of claim 1, further comprising: a plurality of connection screws, wherein the connection screws securely attach the cold plate removal device to a cold plate.

6. The cold plate removal device of claim 1, further comprising: a hand insert within the main portion, wherein the hand insert enables an individual to pull the cold plate removal device away from the graphics processing unit module via the hand insert.

7. An information handling system comprising:
a graphics processing unit module including a top surface;
a cold plate system in physical communication with the graphics processing unit module; and
a cold plate removal device in physical communication with the cold plate system, the cold plate removal device including:
a main portion;
an arm portion extending from the main portion, the arm portion to provide a leverage force to the main portion; and
a pivot screw in physical communication with the arm portion, the pivot screw to transition between an upper position and lower position, the pivot screw to exert a force on the arm portion when the pivot screw is in the lower position and in physical communication with the top surface of the graphics processing unit module.

8. The information handling system of claim 7, wherein the arm portion includes a pivot portion and a removal hole within the pivot portion, the removal hole is in physical communication with the pivot screw.

9. The information handling system of claim 8, wherein the pivot screw includes threads, a stop, and a washer, wherein the washer is in physical communication with the stop and a lower surface of the removal hole when the pivot screw is in the upper position.

10. The information handling system of claim 7, wherein the cold plate removal device further comprises: a plurality of connection screws, wherein the connection screws securely attach the cold plate removal device to the cold plate system.

11. The information handling system of claim 7, further comprising: a thermal interface material in physical communication with the cold plate system and with the graphics processing unit module, wherein the thermal interface material creates a bonding force between the cold plate system and the graphics processing unit module.

12. The information handling system of claim 11, wherein a torque is created between the pivot screw and the arm portion as the pivot screw transitions toward the lower position.

13. The information handling system of claim 12, wherein a reaction force generated based on the torque is applied to the cold plate system from the cold plate removal device, wherein a direction of the reaction force is away from the graphics processing unit module.

14. The information handling system of claim 13, when the reaction force is greater than the bonding force, the cold plate removal device pulls the cold plate system away from the graphics processing unit module.

15. An information handling system comprising:
a graphics processing unit module including a top surface and a graphics processing unit chipset;
a cold plate system in physical communication with the graphics processing unit module;
a thermal interface material in physical communication with and located between the graphics processing unit chipset and the cold plate system; and
a cold plate removal device in physical communication with the cold plate system, the cold plate removal device including:
a main portion;
a plurality of connection screws, wherein the connection screws securely attach the cold plate removal device to the cold plate system;
an arm portion extending from the main portion, the arm portion to provide a leverage force to the main portion; and
a pivot screw in physical communication with the arm portion, the pivot screw to transition between an upper position and lower position, wherein the pivot screw exerts a force on the arm portion when the pivot screw is in the lower position and in physical communication with the top surface of the graphics processing unit module.

16. The information handling system of claim 15, wherein the arm portion includes a pivot portion and a removal hole within the pivot portion, the removal hole is in physical communication with the pivot screw.

17. The information handling system of claim 16, wherein the pivot screw includes threads, a stop, and a washer, wherein the washer is in physical communication with the stop and a lower surface of the removal hole when the pivot screw is in the upper position.

18. The information handling system of claim 15, wherein the thermal interface material creates a bonding force between the cold plate system and the graphics processing unit module.

19. The information handling system of claim 18, wherein a reaction force generated based on a torque from the pivot screw is applied to the cold plate system from the cold plate removal device, wherein a direction of the reaction force is away from the graphics processing unit module.

20. The information handling system of claim 19, when the reaction force is greater than the bonding force, the cold plate removal device pulls the cold plate system away from the graphics processing unit module.

* * * * *